Dec. 14, 1965 R. S. DAHLBERG, JR 3,223,993

NON-LINEAR DIGITAL-TO-ANALOG CONVERTER

Filed Oct. 30, 1961

INVENTOR.
ROBERT S. DAHLBERG, JR.
BY
Fordyce A. Bothwell
ATTORNEY

3,223,993
NON-LINEAR DIGITAL-TO-ANALOG CONVERTER

Robert S. Dahlberg, Jr., Blue Bell, Pa., assignor, by mesne assignments, to Philco Corporation, Philadelphia, Pa., a corporation of Delaware
Filed Oct. 30, 1961, Ser. No. 148,384
2 Claims. (Cl. 340—347)

This invention relates to non-linear digital-to-analog converters, i.e. those adapted to produce an output voltage which is a non-linear function of the input code signal. Such converters are useful, for example, in pulse code modulation systems employing companding, i.e. compression at the encoder and expansion at the decoder.

It is well-known that companding is highly desirable in pulse code modulation systems, but heretofore its use has been limited because of the difficulties of achieving and maintaining the necessary precise inverse matching of the compressor and the expander. This has required initial selection and adjustment of networks to achieve the matching, and subsequent maintenance against the mismatching effects of age and temperature changes on the components.

The principal object of the present invention is to provide a simple non-linear digital-to-analog converter which overcomes these difficulties.

It is well known in the art that circuit components can be switched in and out according to the value of a digital code signal. The present invention is based on the concept of utilizing this technique in a novel way to effect linear to non-linear conversion.

The non-linear converter provided by this invention comprises a cascade arrangement of a linear digital-to-analog converter and a digital signal-controlled variable resistance, which in combination provide a novel non-linear converter. This combination may be used in a feedback pulse code modulator encoder to provide the desired compression characteristic, and the same combination may be used in the decoder to provide the inverse expansion characteristic.

The linear digital-to-analog converter, which forms a part of the combination, is a known type of device which has substantially constant internal impedance and which produces a voltage that is a linear function of the input code signal. The variable resistance network, which forms the other part of said combination, serves cooperatively with said impedance to effect conversion of said voltage to an output voltage which is a non-linear function of the input code signal.

The invention may be fully understood from the following detailed description with reference to the accompanying drawing wherein FIG. 1 is a simplified illustration of a non-linear digital-to-analog converter according to this invention;

Figure 1:
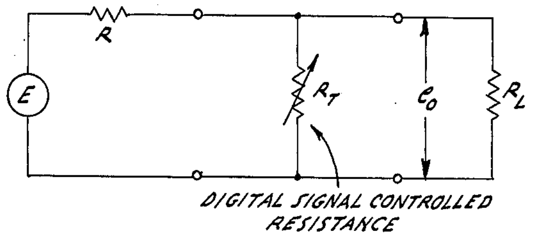

Referring first to FIG. 1, the voltage source E and the resistor R represent any of the known forms of linear digital-to-analog converters having a constant internal impedance. The voltage E is proportional to the number to be decoded, and the resistor R represents the internal impedance of the converter as a source. For example, the converter may be a linear ladder network as shown in FIGS. 5–20 on page 5–33 of the book entitled "Notes on Analog-Digital Conversion Techniques," edited by A. K. Susskind, published in 1958 jointly by the Technology Press of Massachusetts Institute of Technology and John Wiley and Sons, Inc., New York.

The variable resistance termination $R_T$, provided in accordance with this invention, serves to impart the desired non-linearity to the output voltage $e_0$ which appears across the load $R_L$. As hereinafter described $R_T$ is controlled by the digital code signal to achieve the desired non-linearity. The load of course represents any signal utilization device to which a non-linear analog signal is to be supplied.

Figure 2:
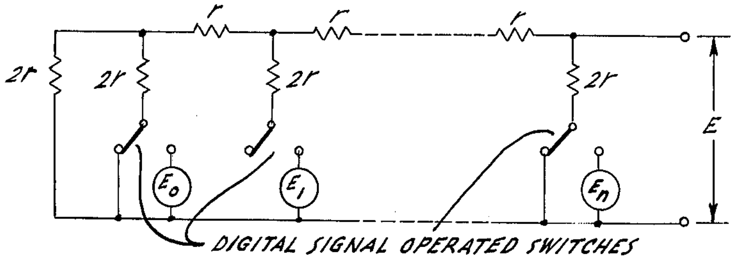
FIG. 2 is a schematic illustration of a linear ladder converter which may be employed in the converter of this invention.

FIG. 2 shows a possible form of the above-mentioned linear ladder network which is represented by E and R in FIG. 1. The network comprises series resistors having a value $r$ and shunt resistors having a value $2r$. There are a number of branches corresponding in number to the number of digits $(n+1)$ in the binary code group employed, the digits being numbered 0, 1, 2 . . . $n$. In these branches are voltage sources $E_0$ to $E_n$ which are switched in and out by digital signal operated switches. At each instant each of the digits represented by a signal is either ONE or ZERO. When a digit is ONE the controlled voltage source is switched in, and when a digit is ZERO the controlled voltage source is switched out.

The network of FIG. 2 produces the voltage E which is a linear function of the digits and which is converted to the desired non-linear form by the variable resistance termination $R_T$ of FIG. 1. To understand the principle involved, suppose that at a given instant the voltage E is at its maximum and that resistance $R_T$ is likewise at its maximum, so that the voltage applied to the load is at its maximum. Now suppose that voltage E is reduced to half its maximum and that resistance $R_T$ is reduced simultaneously. Obviously the voltage applied to the load will be reduced to less than half its maximum. As voltage E is further reduced, $R_T$ can also be further reduced with the result that the voltage applied to the load is reduced more than proportionally to the reduction in voltage E. Thus the combination of the linear converter network and the variable resistance termination can be caused to achieve non-linear digital-to-analog conversion. If the terminating resistance $R_T$ is related to the binary number in a precise digitally controlled manner, the desired non-linear conversion is achieved.

Figure 3:
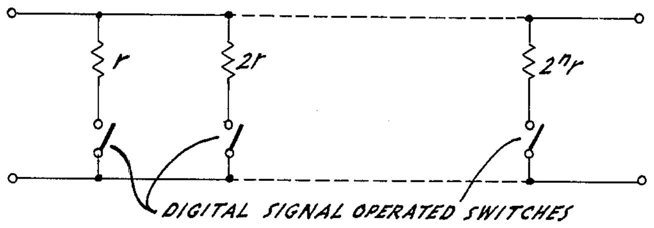
FIG. 3 is a schematic illustration of a variable resistance termination which may be employed in the converter of this invention.

The variable resistance termination $R_T$ may be of the form shown in FIG. 3. In this network there are as many shunt branches as there are digits in the binary code group employed. The resistors are binarily related in value, the respective values being $r$, $2r$, $2^2r$ . . . $2^nr$, there being $n+1$ digits. The resistors are switched in and out by digital signal operated switches which may be transistors. Each switch is closed if the associated digit is ZERO and is opened if the digit is ONE.

Figure 4:
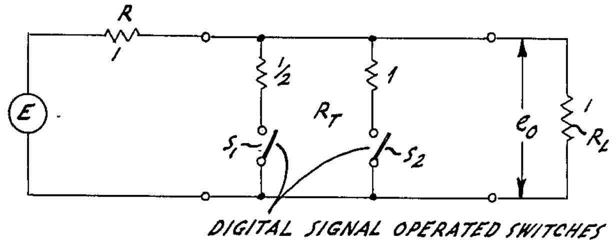
FIG. 4 is a simple illustration of a two digit non-linear digital-to-analog converter according to this invention.
Figure 5:
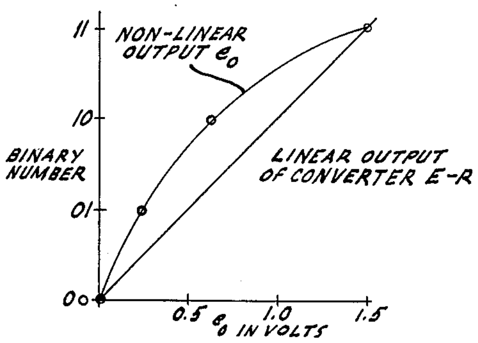
FIG. 5 is an illustration of the non-linear characteristic of the converter of FIG. 4.

By way of illustration, FIG. 4 shows a simple converter according to this invention for a two-digit code group, with the resistors having the ohmic values indicated. FIG. 5 shows how the linear output of converter E–R is converted to non-linear form. The two-digit number has four values as shown along the ordinate of FIG. 5. Suppose that E increases one volt for each of said values, starting with zero for the first value 00. For each value, the output voltage $e_0$ is equal to $$E\cdot\frac{R_x}{R+R_x}$$

where $R_x$ is the resultant resistance of $R_T$ and $R_L$.

For value 00 since E is zero, $e_0$ is also zero.

For value 01 switch $S_1$ is closed and switch $S_2$ is open. Therefore $R_x$ is 1/3 ohm and since E is 1 volt, $e_o$ is 0.25 volt.

For value 10 switch $S_1$ is open and switch $S_2$ is closed. Therefore $R_x$ is 1/2 ohm and since E is 2 volts, $e_o$ is 0.67 volt.

For value 11 both switches $S_1$ and $S_2$ are open. Therefore $R_x$ is 1 ohm and since E is 3 volts, $e_o$ is 1.5 volts.

Thus as shown in FIG. 5 the output voltage $e_o$ is non-linear and its increments become larger for larger outputs. The shape of the non-linear curve can be varied by appropriate choice of the resistors constituting $R_T$ in relation to R.

From the foregoing description it will be seen that this invention provides a simple non-linear digital-to-analog converter in which a digital code signal is converted to a linear analog signal and the latter is converted to a non-linear analog signal by means of a variable resistance which is varied in predetermined relation to said code signal so as to achieve the desired non-linearity of the analog signal. Due to its simplicity and the nature of the components constituting the non-linear converter of this invention it is substantially free of the objections and difficulties of prior devices.

It will be understood of course that the invention is not limited to the specific forms shown and described but contemplates such modifications and other embodiments as may become apparent to those skilled in the art.

I claim:

1. A non-linear digital-to-analog converter, comprising: a linear digital-to-analog converter having substantially constant internal impedance and adapted to produce an analog signal linearly related to an applied binary digital signal; a two-terminal resistance network connected across the output of said converter, said network comprising a plurality of signal paths connected in shunt between said two terminals and corresponding respectively to the digits of said applied binary signal, each of said signal paths including a series combination of a resistor and a switch operated by said applied binary signal, said resistors having the respective fixed values $r$, $2r$, $2^2r$ . . . $2^nr$, $n$ being one less than the number of digits in said applied binary signal, each of said switches being closed or opened according to whether the corresponding digit of said binary signal is ZERO or ONE, thereby to convert said analog signal to one which is non-linearly related to said applied signal; and a load connected between said two terminals of said network.

2. A non-linear digital-to-analog converter according to claim 1, wherein said linear converter comprises a network having shunt branches corresponding respectively to the digits of said applied binary signal, each of said branches comprising a resistor, a voltage source, and a switch operated by said applied binary signal for switching the voltage source in or out according to whether the corresponding digit of said binary signal is ONE or ZERO.

References Cited by the Examiner

UNITED STATES PATENTS 2,839,744 6/1958 Slocomb ............ 340—347
2,892,147 6/1959 Bell ............... 340—347

MALCOLM A. MORRISON, *Primary Examiner.*